United States Patent [19]

Tseng

[11] Patent Number: 5,705,438
[45] Date of Patent: Jan. 6, 1998

[54] METHOD FOR MANUFACTURING STACKED DYNAMIC RANDOM ACCESS MEMORIES USING REDUCED PHOTORESIST MASKING STEPS

[75] Inventor: Horng-Huei Tseng, Hsinchu, Taiwan

[73] Assignee: Vanguard International Semiconductor Corporation, Hsin-Chu, Taiwan

[21] Appl. No.: 735,061

[22] Filed: Oct. 18, 1996

[51] Int. Cl.⁶ .............................................. H01L 21/8234
[52] U.S. Cl. .......................... 438/238; 438/253; 438/381
[58] Field of Search .................................. 438/238, 253, 438/381, 396

[56] References Cited

U.S. PATENT DOCUMENTS

| | | | |
|---|---|---|---|
| 4,864,464 | 9/1989 | Gonzalez | 361/311 |
| 5,134,085 | 7/1992 | Gilgen et al. | 437/52 |
| 5,292,677 | 3/1994 | Dennison | 437/52 |
| 5,338,700 | 8/1994 | Dennison et al. | 437/60 |
| 5,389,566 | 2/1995 | Lage | 437/52 |
| 5,498,562 | 3/1996 | Dennison et al. | 437/52 |
| 5,500,544 | 3/1996 | Park et al. | 257/296 |

Primary Examiner—John Niebling
Assistant Examiner—Joni Y. Chang
Attorney, Agent, or Firm—George O. Saile; Stephen B. Ackerman

[57] ABSTRACT

A method for manufacturing stacked dynamic random access memory using reduced photomask steps was achieved. The invention utilizes two masking steps for forming the array of stacked capacitors and bit line contacts. One of the masking steps is used to concurrently form the bit line contact openings and to define the capacitor top electrode area for the stacked capacitors. After forming the array of field effect transistors by conventional means, an array of capacitor bottom electrodes is patterned from an $N^+$ doped polysilicon layer using the first photoresist mask and plasma etching. An interelectrode dielectric layer is formed on the bottom electrodes. An $N^+$ doped second poly-silicon layer and insulating layer are deposited. The insulating layer and second polysilicon layer are patterned with a second photoresist mask and plasma etched to concurrently form the bit line contact openings and to define the capacitor top electrode plate. The sidewalls of the exposed second polysilicon layer in the bit line contact openings are then oxidized to prevent the top electrode plate from shorting to the bit lines which are then patterned from a polycide layer that extends over and in the bit line contact openings.

21 Claims, 7 Drawing Sheets

METHOD FOR MANUFACTURING STACKED DYNAMIC RANDOM ACCESS MEMORIES USING REDUCED PHOTORESIST MASKING STEPS

BACKGROUND OF THE INVENTION (1) Field of the Invention

This invention relates to an integrated circuit semiconductor device, and more particularly, to a method for fabricating dynamic random access memory (DRAM) using reduced masking steps to form the capacitor plates and bit line contacts, thereby reducing manufacturing costs.

(2) Description of the Prior Art

Dynamic random access memory (DRAM) is used for storing digital information on arrays of memory cells. Each memory cell is comprised of a single pass transistor and a single capacitor. Typically the pass transistor is a field effect transistor (FET). The capacitor is formed either by etching a trench in the substrate, or forming stacked capacitors by depositing and patterning conducting layers over and within the individual cell areas after fabricating the individual pass transistors. The stacked capacitors are relatively simple to manufacture, and in general the DRAM devices are desirable because of their low manufacturing costs relative to other memory devices. However, it is still desirable to reduce the number of processing steps, more specifically to use fewer masking steps to further reduce the costs of DRAM device fabrication.

The array of individual DRAM storage cells making up part of the DRAM circuit on the chip stores binary data (bits) as electrical charge on the storage capacitor. This information is stored or retrieved from the storage capacitor by means of a pass transistor on each memory cell, and by address and read/write circuits on the periphery of the DRAM chip. The pass transistor is usually a field effect transistor (FET) and the single capacitor in each cell is either formed in the semiconductor substrate as a trench capacitor or built over the FET in the cell area as a stacked capacitor. However, as these volatile memory cell array density increases on the DRAM chip, the capacitor is reduced in size and it becomes increasingly difficult to store sufficient charge. Further, maintaining sufficient charge also requires more frequent refresh cycles which further slow the circuit performance. In recent years the difficulty in fabricating trenches with increasing capacitor area, hence increased capacitance, has directed one to the fabrication of stacked capacitors which can be built vertically over each memory cell area. This allows one more latitude in designing the capacitor, but in general also makes the process more complex and costly.

Several methods have been described for forming these DRAM devices using a reduced number of masking steps to improve the manufacturing cost performance.

One method of forming the array of memory cells on the DRAM device is described by F. Gonzalez, U.S. Pat. No. 4,864,464. In this method a low-profile fold-plate DRAM cell capacitor is fabricated using two masking steps to form the capacitor, and a separate mask to form the bit line contact openings. The method utilizes the area on the substrate adjacent to the capacitor node contact to increase the capacitor area. However this requires more cell area and limits the minimum size of the cell.

Another method for forming stacked capacitor cells using reduced masking steps and a split-polysilicon CMOS process is described by B. D. Gilgen et al., U.S. Pat. No. 5,134,085. In this approach a reduced-mask, split-polysilicon CMOS process incorporating stacked-capacitor cells is used for making DRAM devices (circuits). Two masking levels are used to make the stacked capacitors and one making level for making the bit line contact openings. Still another method for making stacked capacitors on DRAM devices using a reduced mask CMOS process and utilizing a single etch-stop layer for contacts is described by C. H. Dennison, U.S. Pat. No. 5,292,677. In this approach Dennison utilizes one mask to open the node contact for the capacitor bottom electrode (plate), and then uses a photoresist fill and etch back (or ash) to define the bottom electrodes. A second photoresist mask is used to etch the bit line contact openings through the upper insulating layer, the capacitor top electrode plate and to the source/drain contact areas. Then, as shown in Dennison's FIG. 12, he uses insulating sidewall spacers in the bit line contact openings to keep the top electrodes and portions of the FET gate electrodes from electrically shorting to the bit lines when bit lines are formed in the bit line contact openings. A U.S. patent by C. S. Lage (U.S. Pat. No. 5,389,566) also teaches a method for making electrical contact to an FET source/drain contact for ferromagnetic memory devices using a sidewall spacer technology, but since he does not make DRAM devices he does not incorporate stacked capacitor structures.

There is still a strong need in the semiconductor industry to further reduce the number of processing steps while improving reliability and cost performance.

SUMMARY OF THE INVENTION

Accordingly, it is a principal object of this invention to provide a method for fabricating DRAM devices having stacked capacitors using fewer masking steps.

Another object of the present invention is to provide a method for forming the capacitor plate area and bit line contact openings using a single mask.

It is still another object of this invention to oxidize the sidewalls of the exposed top plate of the capacitors in the bit line contacts to electrically isolate the bit lines from the top capacitor plate.

The improved DRAM cells making up the array of memory cells on the DRAM device are formed using a single mask to pattern the top electrode plate of the capacitor formed from a polysilicon layer, and concurrently etch the bit line contact openings. The exposed sidewalls of the polysilicon layer in the bit line contact openings are then thermally oxidized to electrically isolate the top plate from the bit lines which also extend within the bit line contact openings. This method requires only one single masking step, and improves the cost performance.

The method for fabricating dynamic random access memory cells having these stacked storage capacitors begins by providing an array of device areas on a semiconductor substrate, such as on a single crystal silicon substrate doped with a P-type conductive dopant (e.g., boron). The device areas are provided by forming a relatively thick field oxide surrounding and electrically isolating each device area. One method of forming the field oxide areas is by protecting the device areas from oxidation by depositing and patterning a silicon nitride ($Si_3N_4$) layer and thermally oxidizing the exposed field oxide areas on the silicon substrate. This method is typically referred to in the semiconductor industry as the LOCal Oxidation of Silicon (LOCOS) method. After removing the silicon nitride layer, a thin gate oxide is formed on the silicon substrate in the device areas, and a first poly-silicon layer having a cap oxide (SiO$_2$) is patterned to form the FET gate electrodes, and interconnecting word lines. Lightly doped source/drain areas are formed adjacent to the gate electrodes, usually by ion implantation of an N-type dopant, such as arsenic (As) or phosphorus (P), and then sidewall spacers are formed, usually by depositing an insulator (SiO$_2$) and aniso-tropically etching back. The FETs are then completed by using a second N-type dopant implant to form the FET source/drain contact areas. A first insulating layer, such as silicon oxide, is deposited in which are etched node contact openings to one of the two source/drain contact areas of each FET. A conformal second polysilicon layer is deposited on the substrate and is then doped N$^+$ with arsenic (As) or phosphorus (P). This second polysilicon layer is then patterned using conventional photolithography and aniso-tropic plasma etching leaving portions over the first of the two source/drain contact areas of each FET to form the bottom electrodes for the stacked capacitors. A second insulating layer is formed to provide a thin conformal interelectrode dielectric layer on the array of bottom electrodes. This dielectric layer can be formed by thermally oxidizing the bottom electrode surface to provide a silicon oxide (SiO$_2$), and further a portion of the SiO$_2$ can be converted to a silicon nitride (Si$_3$N$_4$) to form a silicon oxide/silicon nitride (ON) dielectric layer. Alternatively, a silicon oxide/silicon nitride/silicon oxide (ONO) can be formed in a similar fashion. A conformal third polysilicon layer is then deposited over the dielectric layer and elsewhere on the substrate over the first insulating layer. This layer will be patterned later to form the top electrode plate, and at the same time form the bit line contact openings to the second of the two source/drain contact areas of each FET. A third insulating layer is deposited over the blanket third polysilicon layer. This third insulating layer is a chemical vapor deposited (CVD) oxide, such as SiO$_2$, and can be made planar, for example, by chemical/mechanical polishing. Alternatively, a borophosphosilicate glass (BPSG) can be used for the third insulating layer and can be locally levelled by thermal annealing.

Bit line contact openings are now etched using conventional photoresist masking and plasma etching through the third insulating layer and the third polysilicon layer over the second source/drain contact areas of each FET. An important feature of this invention is that this etching step is also used simultaneously to define the capacitor top electrode area. The bit line contact openings have essentially vertical sidewalls down to the surface of the first insulating layer. Another important feature of this invention is the thermal oxidation of the sidewalls of the third polysilicon layer within the bit line contact openings. This prevents the capacitor top electrode from shorting to the bit lines that are later formed over and in the bit line contact openings. The first insulating layer exposed in the bit line contact openings is now removed to expose the second source/drain area of each FET. For example, the etching can be carried out by magnetically enhanced reactive ion etching (MERIE). The DRAM structure up to the formation of the bit lines is now completed by depositing a blanket conformal conducting layer, which is then patterned by photoresist masking and etching to form the bit lines contacting the second source/drain contact area in each FET. For example, the conducting layer can be a metal, such as aluminum copper (AlCu) alloy, or alternatively, a polycide layer composed of a fourth polysilicon layer and a refractory metal silicide such as tungsten silicide (WSi$_2$).

BRIEF DESCRIPTION OF THE DRAWINGS

The objects and advantages of this invention are best understood with reference to the attached drawings in the FIGS. and the embodiment that follows.

DESCRIPTION OF THE PREFERRED EMBODIMENT

Now in keeping with the objects of this invention, the method for forming the stacked capacitors and bit line contact openings using only two masking steps is covered in detail. This improved DRAM structure can be fabricated using FETs as the pass transistors that are currently used in the manufacture of DRAMs.

This DRAM structure is usually formed on a P-doped semiconductor substrate using N-channel field effect transistors (N-FET) as the pass transistors in each of the memory cells. It should also be well understood by one skilled in the art that by including additional process steps, in addition to those described in this embodiment, other types of devices can also be included on the DRAM chip. For example, by forming N-Well regions in the P doped substrate, P-channel FETs can also be provided from which Complementary Metal-Oxide-Semiconductor (CMOS) circuits can be formed, such as are used for the peripheral circuits on the DRAM chip.

Figure 1:
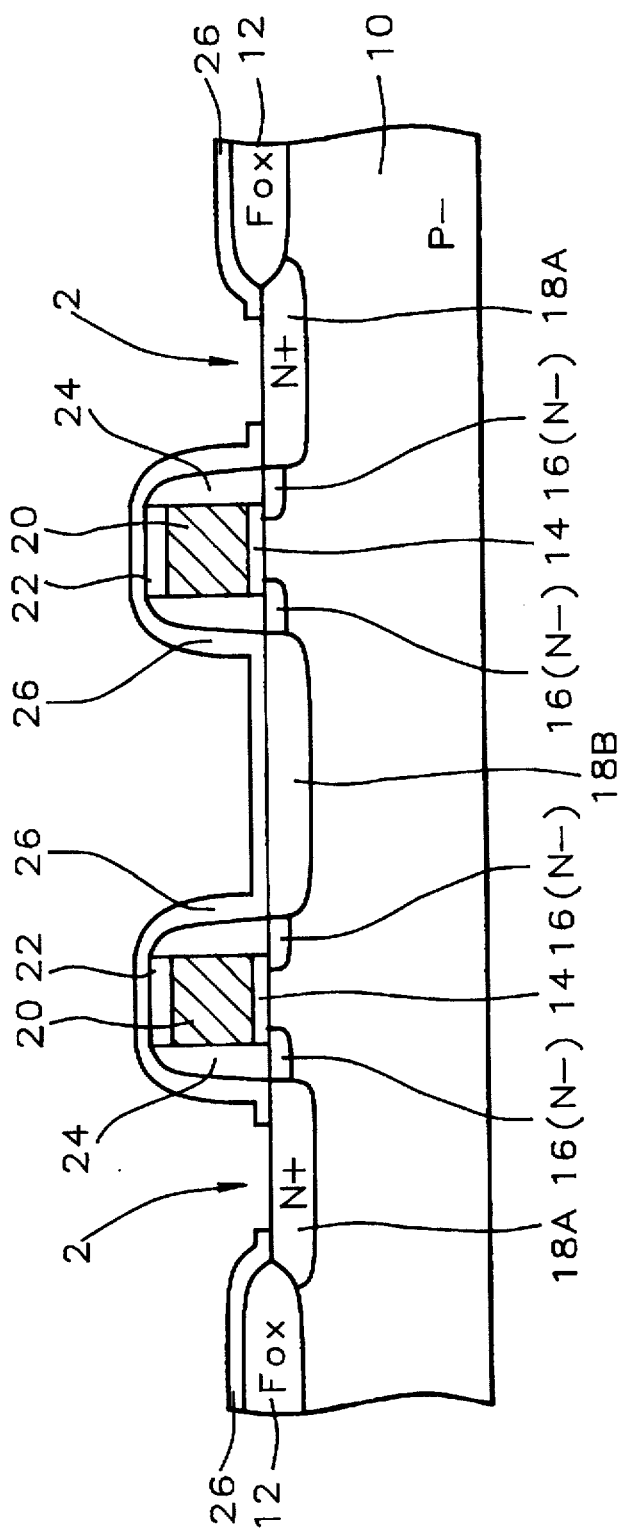
FIGS. 1 through 7 show schematic cross-sectional views for the sequence of processing steps for a portion of a DRAM device cell area having two storage capacitors and a common bit line.

Referring first to FIG. 1, a schematic cross-sectional view of a portion of a semiconductor substrate 10 is shown having partially completed DRAM cells showing two pass transistors (N-channel FETs) formed on and in the substrate surface. The preferred substrate is usually composed of a lightly P-type single crystal silicon having preferably a <100> crystallographic orientation. A relatively thick Field OXide (FOX) 12 is formed surrounding and electrically isolating the individual device regions in which the memory cells are built. The field oxide 12, only partially shown in FIG. 1, is most commonly formed by the LOCal Oxidation of Silicon (LOCOS) method. This LOCOS method involves depositing a thin silicon oxide (pad oxide) and a thicker silicon nitride layer as an oxidation barrier layer on the substrate surface (not shown in FIG. 1). Using conventional photolithographic techniques and etching, the barrier layer is removed in areas where a field oxide is desired, while retaining the silicon nitride in areas where active devices are to be fabricated. The silicon substrate is then subjected to a thermal oxidation to form the field oxide areas 12. The oxide is usually grown to a thickness of between about 3000 and 6000 Angstroms.

The N-channel FETs are now formed in the active device regions after removing the silicon nitride barrier layer and pad oxide in a wet etch. For example, the nitride can be removed in a hot phosphoric acid (H$_3$PO$_4$) etch at about 180° C., and the pad oxide can be removed in a dilute solution of hydrofluoric acid and water (HF/H$_2$O). The gate oxide for the N-FETs is formed next in the device areas by thermally oxidizing the active device regions to form the thin gate oxide 14, as shown in FIG. 1. Typically, the thickness of the gate oxide 14 is between about 50 and 200 Angstroms. After further processing, only portions of the gate oxide 14 remain over the channel regions of the FET, as shown in FIG. 1.

Referring still to FIG. 1, the FET gate electrodes 20 in the device areas are formed next by patterning a multilayer composed of a first polysilicon layer 20 and a cap oxide layer 22 using conventional photolithographic techniques and plasma etching. The first polysilicon layer 20 is deposited, for example, using low pressure chemical vapor deposition (LPCVD) and a reactant gas, such as silane (SiH$_4$). The poly-silicon layer 20 is doped with an N-type conductive dopant, for example, by ion implantation with arsenic ions (As$^{75}$) or phosphorus ions (P$^{31}$). Typically the polysilicon layer 20 is between about 2500 and 3500 Angstroms thick, and is doped to a concentration of between about 1.0 E 19 to 1.0 E 21 atoms/cm$^3$. Alternatively, a refractory metal silicide layer (not shown), such as tungsten silicide (WSi$_2$), can be formed on the poly-silicon layer 20 to increase the electrical conductivity. For example, a tungsten metal can be physically deposited and then sintered to form the silicide. The tungsten can also be deposited by chemical vapor deposition (CVD) using tungsten hexafluoride (WF$_6$) as the reactant gas. The cap oxide 22, usually composed of SiO$_2$, can be deposited using LPCVD by decomposing a reactant gas, such a tetraetho-siloxane (TEOS), and is provided over the gate electrodes 20 to electrically insulate them from portions of the bottom electrodes of the capacitors that are later formed. Typically, the thickness of the cap oxide layer 22 is between about 500 and 1200 Angstroms.

Lightly doped source/drain areas 16(N$^-$) are formed next adjacent to the gate electrodes 20. The lightly doped source and drain areas for the N-FETs are formed by ion implantation of an N-type dopant such as arsenic or phosphorus. For example, a typical implant might consist of phosphorus P$^{31}$ at a dose of between 1.0 E 13 and 1.0 E 14 atoms/cm$^3$ and an energy of between about 30 and 80 Kev. The gate electrodes serve as an implant mask to self-align the source/drain to the electrode, while an additional photo-resist mask can be used to avoid unwanted implants elsewhere on the substrate.

After forming the lightly doped source/drains 16(N$^-$), sidewall spacers 24 are formed on the sidewalls of the gate electrodes 20, also shown in FIG. 1. These sidewall spacers are typically formed by depositing a low-temperature silicon oxide, and then anisotropically etching back to the silicon surface. For example, the silicon oxide can be deposited using LPCVD and tetraethoxysilane (TEOS) at a temperature in the range of about 650° to 900° C., and the etch back is performed in a low pressure reactive ion etcher. An N$^+$ source/drain ion implantation is then used to complete the source/drain areas forming the N$^+$ doped source/drain contact areas 18A and 18B aligned to the sidewall spacers 24, and therefore also aligned to the lightly doped source/drain areas 16(N$^-$), as depicted in FIG. 1.

Still referring to FIG. 1, a first insulating layer 26 is conformally deposited on the substrate 10 as an electrical insulating layer over the exposed source/drain contacts, and then node contact openings 2 are etched to the first of the two source/drain contact areas 18A(N$^+$) of each of the DRAM FETs. The second insulating layer 26 is preferably composed of a LPCVD silicon oxide (e.g., TEOS) and has a preferred thickness of between about 600 and 1500 Angstroms.

Figure 2:
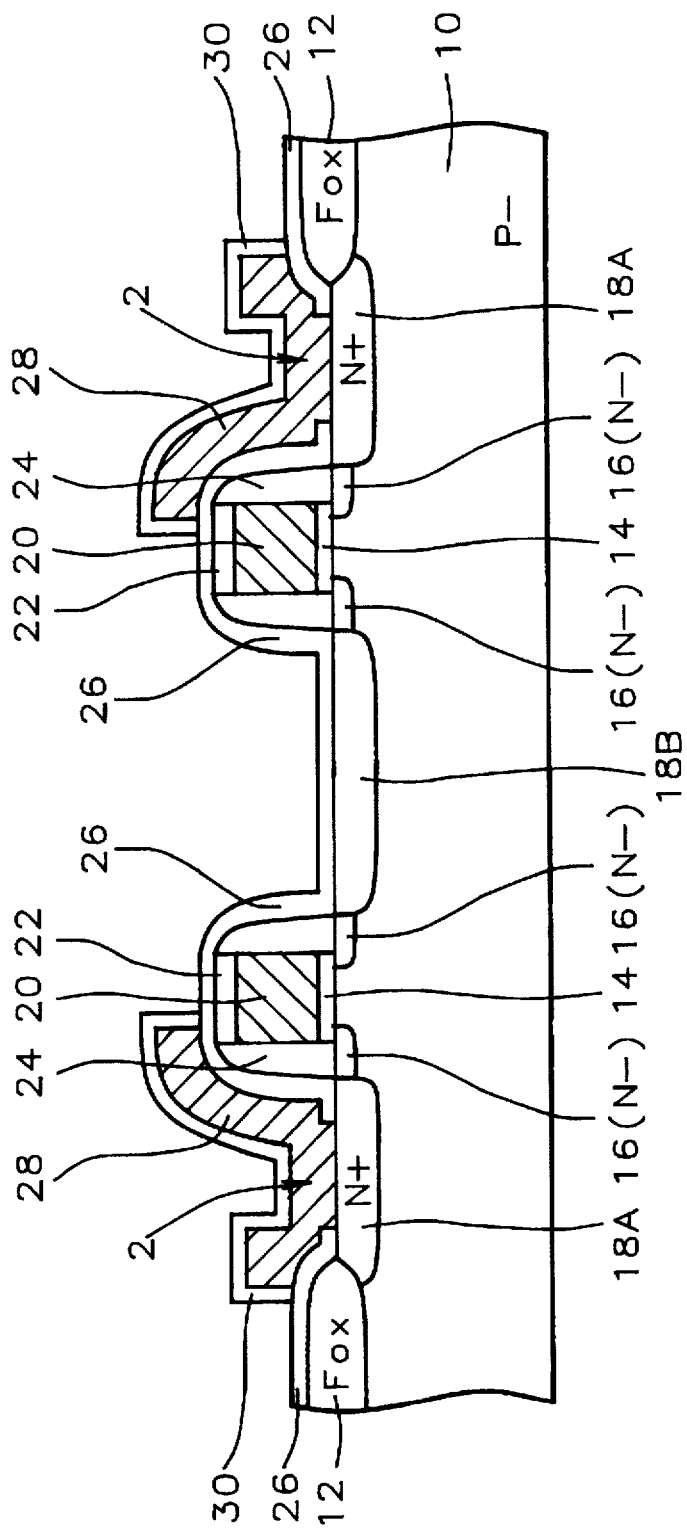

Referring now to FIG. 2, a conformal second polysilicon layer 28 is deposited and patterned to form the bottom electrodes 28 for the stacked capacitors. Preferably polysilicon layer 28 is deposited by LPCVD using, for example, silane as the reactant gas. The preferred thickness of layer 28 is between about 3000 and 8000 Angstroms. Layer 28 is doped with an N-type dopant, such as phosphorus, using ion implantation. The preferred concentration after implantation is between about 1.0 E 19 and 1.0 E 21 atoms/cm$^3$. The bottom electrodes 28 are patterned from poly-silicon layer 28 using a first photo-resist mask (not shown) and anisotropic plasma etching. For example, the etching can be carried out using a reactive ion etcher and an etching gas, such as chlorine, that selectively etches the poly-silicon down to the oxide layer 26.

Still referring to FIG. 2, a second insulating layer 30 is formed on the array of bottom electrodes patterned from poly-silicon layer 28 to provide a thin inter-electrode dielectric layer. The thin dielectric or insulating layer 30 is preferably between about 10 and 100 Angstroms thick and is composed of a material having a high dielectric constant. Layer 30 is preferably composed of silicon oxide-silicon nitride (ON), or a silicon oxide-silicon nitride-silicon oxide (ONO). For example, the surface of the poly-silicon bottom electrodes 28 can be thermally oxidized to form a silicon oxide, and then a thin conformal silicon nitride layer can be deposited using LPCVD to form the ON layer. To form the ONO layer the exposed surface of the Si$_3$N$_4$ layer can then be reduced in an oxidizing ambient at elevated temperatures. Alternatively, other high dielectric constant insulators can be used, such as tantalum pentoxide (Ta$_2$O$_5$).

Figure 3:
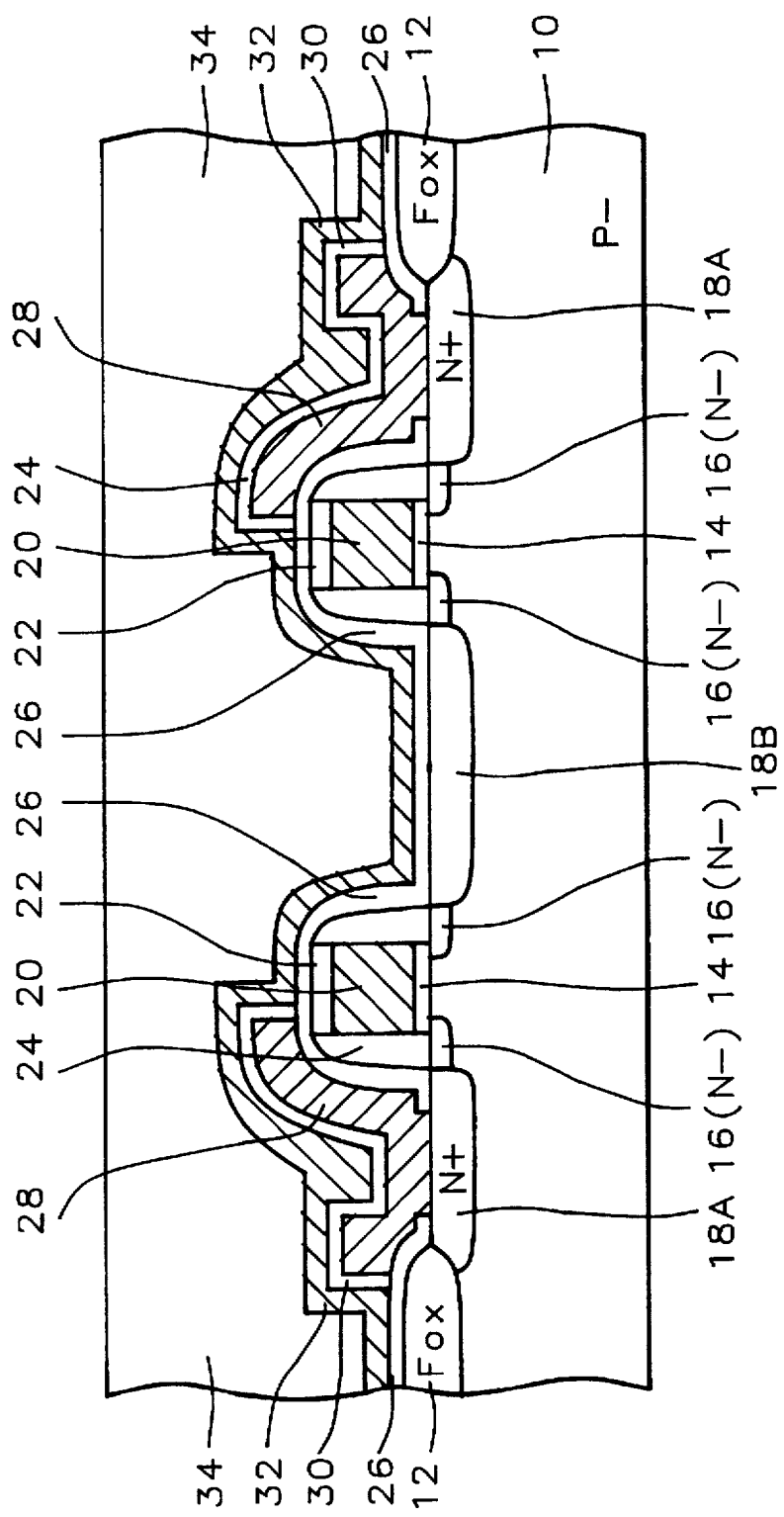

As shown in FIG. 3, a conformal third poly-silicon layer 32 is deposited over the thin interelectrode dielectric layer 30. Layer 32 is later patterned to form the top electrodes for the stacked capacitors at the same time that the bit line contact openings are formed. Preferably the poly-silicon is deposited by LPCVD using, for example, silane as the reactant gas to a thickness of between about 1000 and 2000 Angstroms, and is in-situ doped with an N-type dopant, such as phosphorus having a preferred concentration in the range of between about 1.0 E 19 and 1.0 E 21 atoms/cm$^3$. Alternatively, layer 32 can be doped by ion implantation using, for example, phosphorus ions (P$^{31}$).

Referring still to FIG. 3, a third insulating layer 34 is now deposited over the blanket third polysilicon layer 32. Preferably layer 34 is composed of silicon oxide and is deposited by LPCVD using a reactant gas such as TEOS. The preferred thickness of layer 34 is between about 4000 and 10000 Angstroms. Layer 34 can be made planar, as shown in FIG. 3, by chemical/mechanical polishing. Alternatively, a low-flow temperature glass can be used for layer 34. For example, one can use a borophosphosilicate glass (BPSG) deposited by LPCVD and a reactant gas such as TEOS to which are added dopant gases such as phosphine (PH$_3$) and diborane (B$_2$H$_6$) to the TEOS gas flow. The BPSG can then be annealed to achieve a more planar surface (local planarization).

Figure 4:
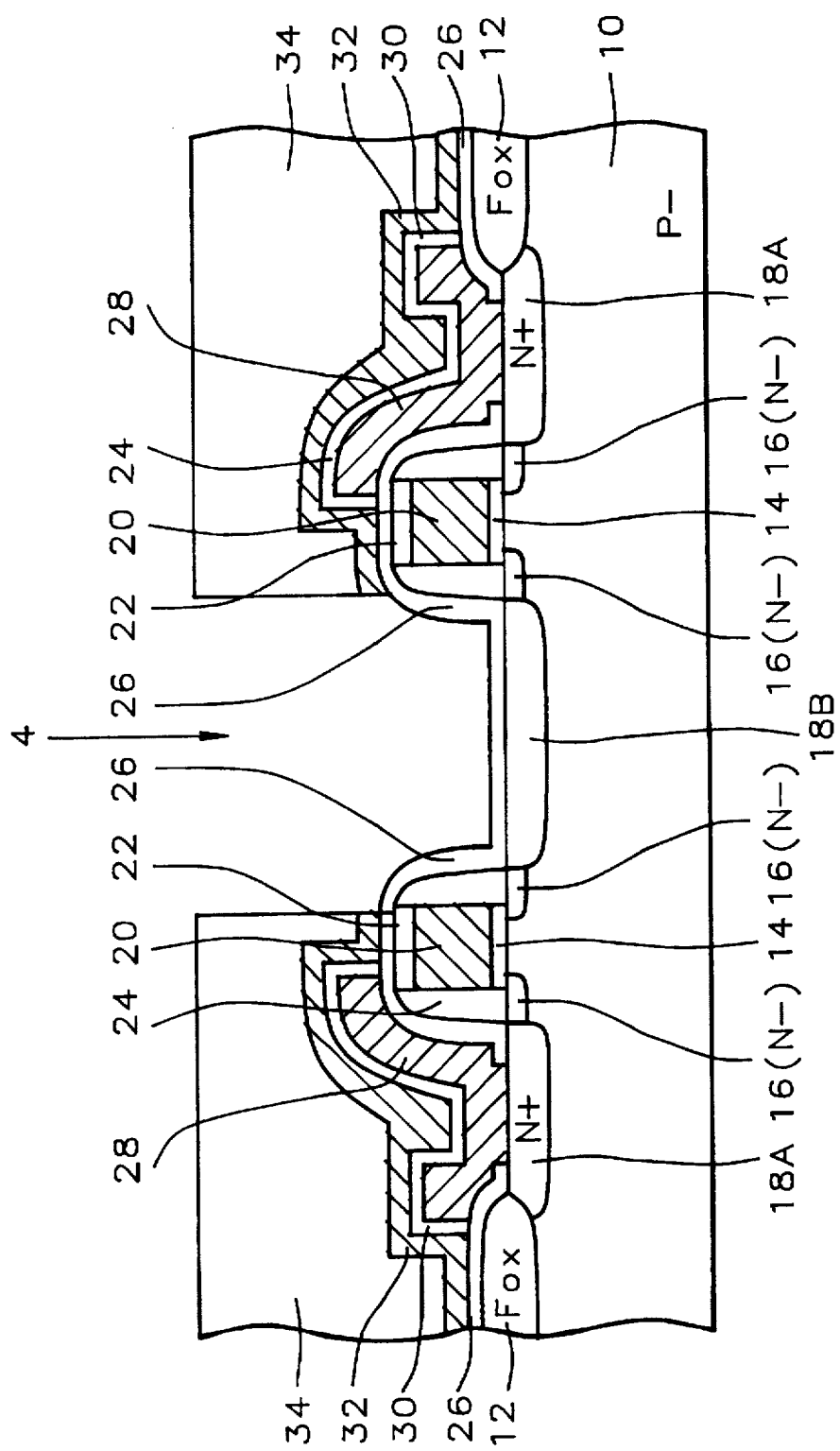

Referring now to FIG. 4, an important feature of the invention is the method for formation of the bit line contact openings to the second source/drain contact areas of each FET. The method consists of using a second photoresist masking and plasma etching to simultaneously etch the bit line contact openings and to define the capacitor top electrode areas. Although the method of forming only one of the bit line contact openings 4 is depicted in FIG. 4, it should be understood at an array of bit line contact openings are made to the second source/drain contact areas 18B(N$^+$) of each FET and the capacitor plate (top electrodes) are patterned at the same time. Proceeding now with the process, using a second photoresist mask (not shown) and anisotropic plasma etching, the contact opening 4 is first etched in the oxide layer 34 to the third poly-silicon layer 32. The contact 4 is preferably etched using reactive ion etching (RIE) or a high plasma density etching at low pressure and an etchant gas such as carbon tetrafluoride (CF$_4$). The contact opening 4 is then further selectively etched into the third poly-silicon layer 32 to the surface of the first insulating layer 26 using an etching gas that has a high etch rate ratio between the poly-silicon layer 32 and oxide layer 26. For example, the poly-silicon can also be etched in a high density plasma etcher at low pressure using a reactant gas mixture such as hydrogen bromide (HBr) and chlorine ($Cl_2$). This provides a contact opening 4 having essentially vertical sidewalls, as shown in FIG. 4.

Figure 5:
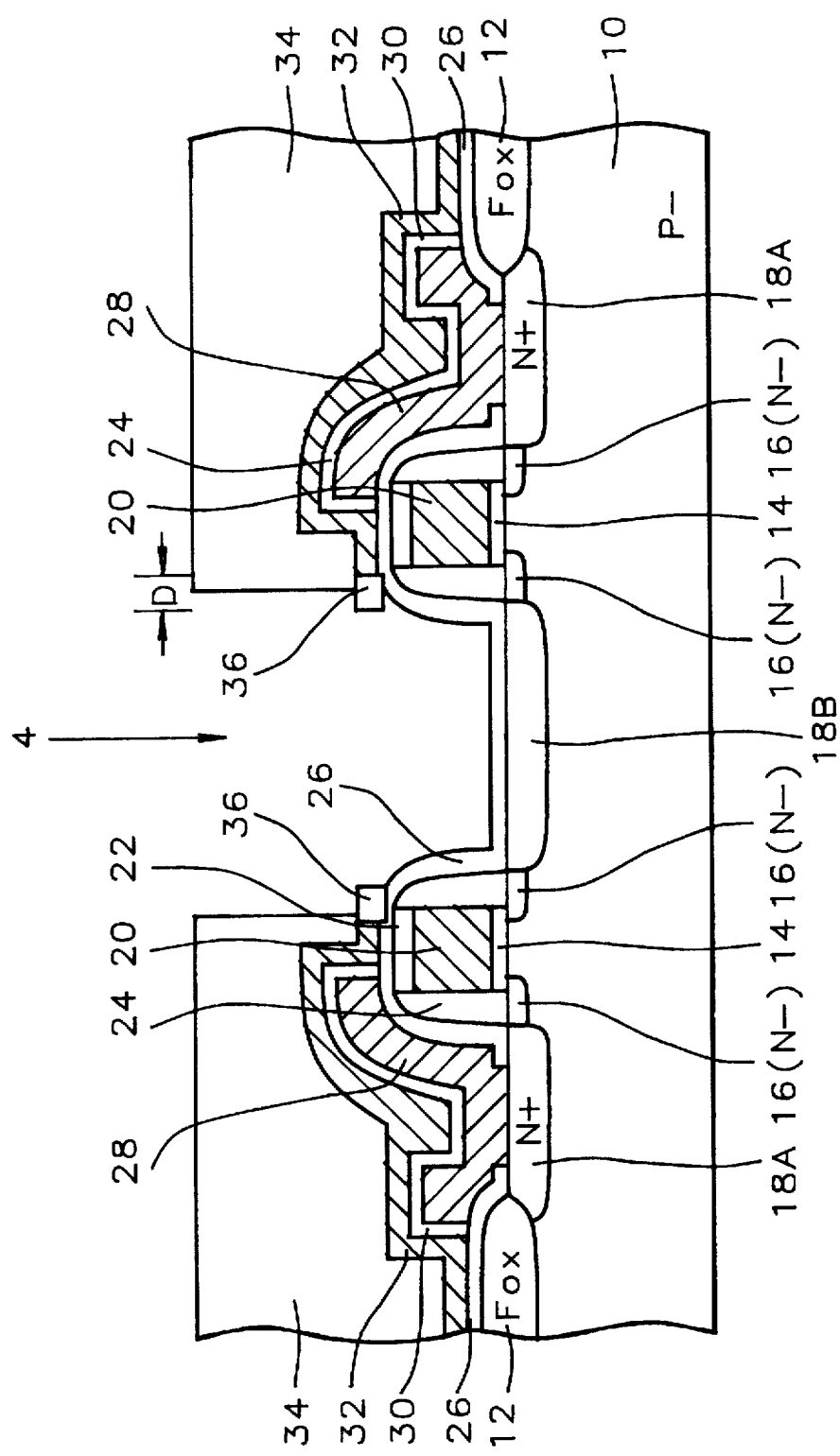

Referring now to FIG. 5, another important feature of this invention is the formation of a thermal oxide 36 on the sidewalls of the third poly-silicon layer 32 within the bit line contact opening 4. This prevents the capacitor top electrode from shorting to the bit lines when the bit lines are later formed extending over and in the bit line contact openings 4. Preferably the thermal oxide 36 is formed by subjecting the substrate to an oxidizing ambient, such as by steam oxidation in an oxidation furnace. The thermal oxide is preferably grown to a thickness of between about 200 and 500 Angstroms, and is depicted in FIG. 5 by the width D. For example, the oxidation can be carried out at a temperature between about 800° and 900° C. for about 10 to 30 minutes.

Figure 6:
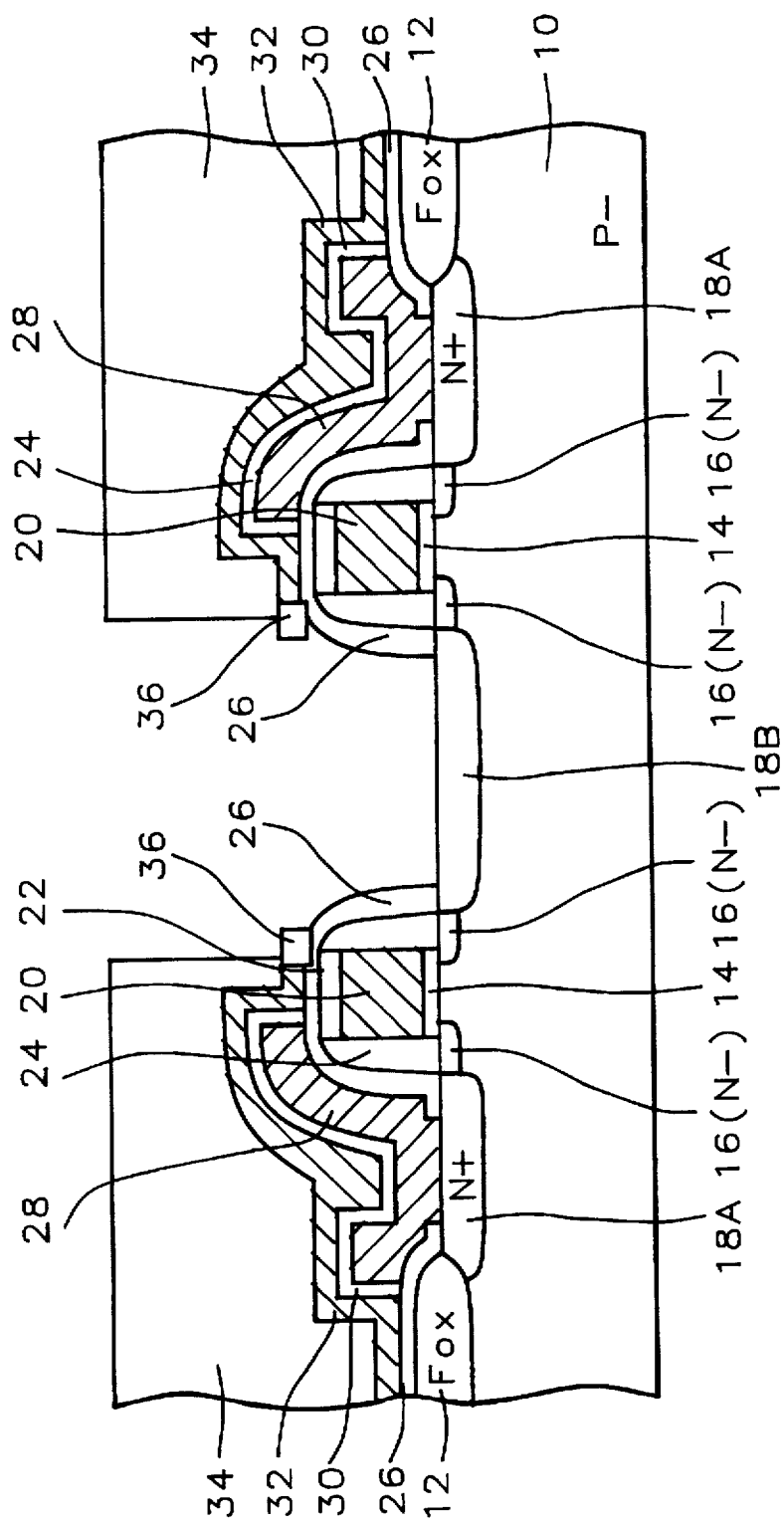

Referring now to FIG. 6, the first insulating layer 26 in the bit line contact opening 4 is now removed to expose the second source/drain contact area 18B($N^+$). For example, the etching can be carried out by magnetically enhanced reactive ion etching (MERIE) using, for example, an etchant gas mixture such as trifluoromethane ($CHF_3$), oxygen ($O_2$) and argon (Ar). Portions of the thermal oxide 36 extending out from the sidewalls are also partially etched back during the removal of layer 26 by MERIE.

Figure 7:
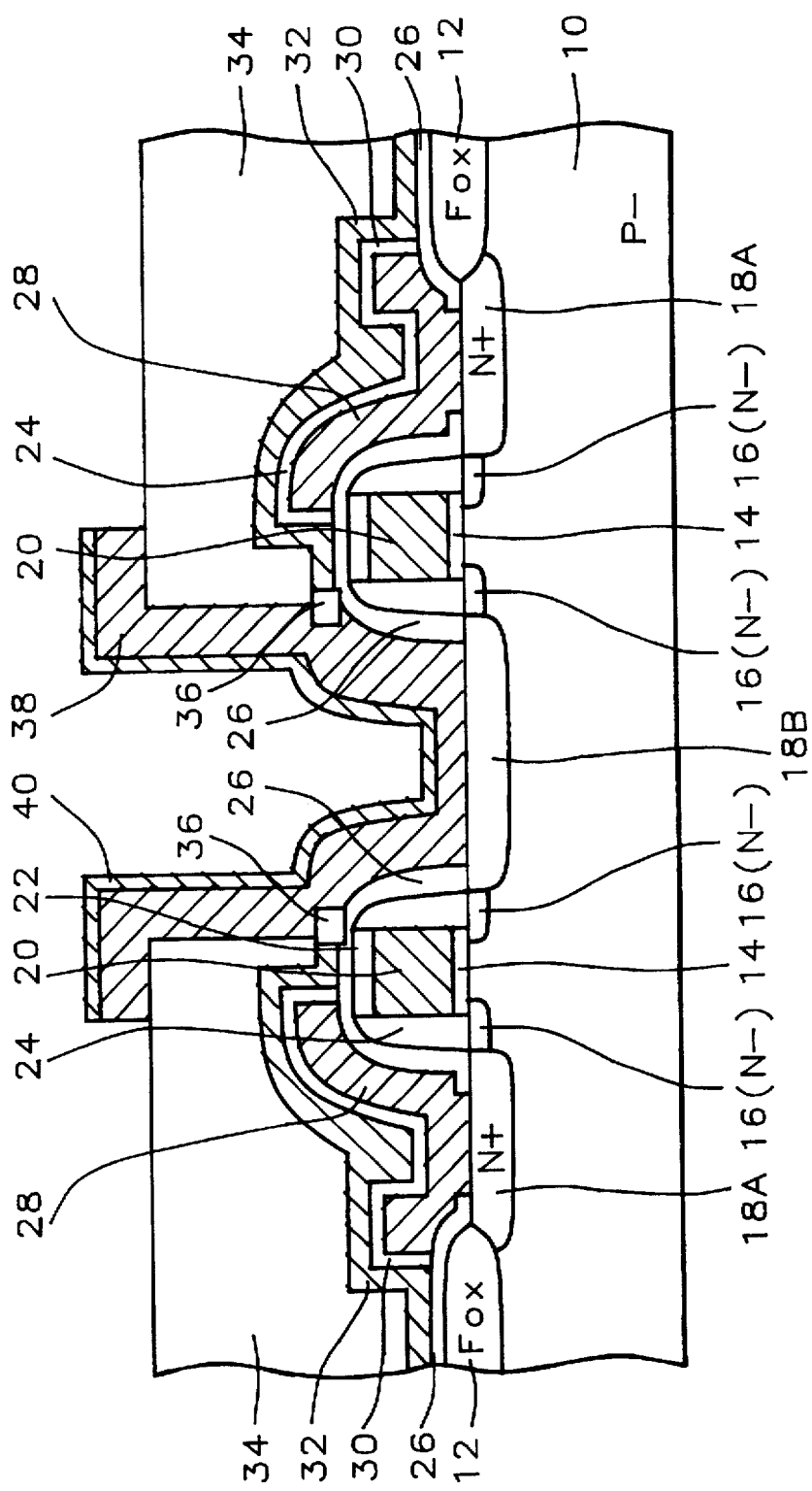

Referring now to FIG. 7, the DRAM structure is completed up to the formation of the bit lines. The bit lines are formed by depositing a conformal fourth poly-silicon layer 38. The preferred method of depositing polysilicon layer 38 is by LPCVD and is in-situ doped $N^+$. For example, phosphorus can be incorporated into the layer by adding a phosphine ($PH_3$) gas to the silane ($SiH_4$) during the LPCVD process. The preferred thickness of fourth polysilicon layer 38 is between about 1000 and 2000 Angstroms. A tungsten silicide ($WSi_2$) layer 40 is then deposited on poly-silicon layer 38 to complete the metallurgy for the bit lines. For example, the $WSi_2$ can be deposited by CVD using a reactant gas such as tungsten hexafluoride ($WF_6$). The silicide layer 40 is deposited to a thickness of between about 1000 and 2000 Angstroms. Conventional photolithographic techniques and plasma etching are then used to pattern the polycide layer (38 and 40) to complete the formation of the bit lines. Alternatively, other metallurgies can be used to form the bit lines. For example, tungsten metallurgy can be used or a refractory metal barrier layer, such as tungsten or titanium, and a high electrically conducting layer, such as an aluminum copper (AlCu) alloy, can be used.

While the invention has been particularly shown and described with reference to the preferred embodiment thereof, it will be understood by those skilled in the art that various changes in form and details may be made without departing from the spirit and scope of the invention.

What is claimed is:

1. A method for manufacturing stacked capacitors and bit lines for an array of dynamic random access memory (DRAM) cells on a semiconductor substrate comprising the steps of:

providing a semiconductor substrate having device areas surrounded and electrically isolated from each other by field oxide areas;

providing field effect transistors (FETs) in said device areas, each of said transistors having a gate electrode formed from a patterned first polysilicon layer, and having first and second source/drain contact areas in said device areas, and electrically insulated by depositing a conformal first insulating layer thereon;

photoresist masking and anisotropically etching contact openings to said first source/drain contact areas of each said FET, thereby forming node contact openings for said stacked capacitors;

depositing a conformal second poly-silicon layer on said substrate;

patterning said second polysilicon layer using a first photoresist mask and anisotropic plasma etching leaving portions of said second polysilicon layer over and in said first source/drain contact areas thereby forming bottom electrodes for said stacked capacitors;

forming a conformal second insulating layer on said patterned second polysilicon layer thereby forming an interelectrode dielectric layer on said bottom electrodes;

depositing a conformal third polysilicon layer over said second insulating layer and elsewhere on said first insulating layer;

depositing a third insulating layer on said third polysilicon layer;

etching bit line contact openings using a second photoresist mask and anisotropic plasma etching over said second source/drain contact areas of each said FET through said third insulating layer and said third polysilicon layer to the surface of said first insulating layer;

forming a thermal oxide on sidewalls of said third polysilicon layer exposed in said bit line contact openings;

blanket etching and removing said first insulating layer in said bit line contact openings to said second source/drain contact areas of each said FET;

depositing a conformal conducting layer on and in said second source/drain contact areas and elsewhere on said third insulating layer;

patterning by photoresist masking and anisotropic plasma etching said conducting layer to form bit lines extending over said bit line contact openings thereby completing said array of DRAM cells having said stacked capacitors and bit lines.

2. The method of claim 1, wherein said first, second, and third poly-silicon layers are doped with $N^+$ type electrically conducting dopant having a concentration of between about 1.0 E 19 and 1.0 E 21 atoms/$cm^3$.

3. The method of claim 1, wherein said first polysilicon is between about 2500 and 3500 Angstroms thick.

4. The method of claim 1, wherein said first insulating layer is between about 600 and 1500 Angstroms thick.

5. The method of claim 1, wherein said second polysilicon layer is between about 3000 and 8000 Angstroms thick.

6. The method of claim 1, wherein said interelectrode dielectric layer is composed of silicon oxide-silicon nitride-silicon oxide (ONO) having a thickness of between about 10 and 100 Angstroms.

7. The method of claim 1, wherein said third polysilicon layer is between about 1000 and 2000 Angstroms thick.

8. The method of claim 1, wherein said third insulating layer is between about 4000 and 10000 Angstroms thick.

9. The method of claim 1, wherein said thermal oxide on said sidewalls of said third polysilicon layer electrically insulates said top electrodes from said bit lines, said thermal oxide grown to a thickness of between about 200 and 500 Angstroms.

10. The method of claim 1, wherein said conducting layer is a multilayer composed of an $N^+$ doped polysilicon layer and a tungsten silicide layer.

11. A method for manufacturing DRAM devices having arrays of stacked capacitors and bit lines on a semiconductor substrate comprising the steps of:

prov018140a semiconductor substrate having device areas surrounded and electrically isolated from each other by field oxide areas;

providing field effect transistors (FETs) in said device areas, each of said transistors having a gate electrode formed from a patterned first polysilicon layer, and having first and second source/drain contact areas in said device areas, and electrically insulated by depositing a conformal first insulating layer thereon;

photoresist masking and anisotropically etching contact openings to said first source/drain contact areas of each said FET, thereby forming node contact openings for said stacked capacitors;

depositing a conformal second poly-silicon layer on said substrate;

patterning said second polysilicon layer using a first photoresist mask and anisotropic plasma etching leaving portions of said second poly-silicon layer over and in said first source/drain contact areas thereby forming bottom electrodes for said stacked capacitors;

forming a conformal second insulating layer on said patterned second polysilicon layer thereby forming an interelectrode dielectric layer on said bottom electrodes;

depositing a conformal third poly-silicon layer over said second insulating layer and elsewhere on said first insulating layer;

depositing a third insulating layer on said third polysilicon layer;

etching bit line contact openings using a second photoresist mask and anisotropic plasma etching over said second source/drain contact areas of each said FET through said third insulating layer and said third polysilicon layer to the surface said first insulating layer;

forming a thermal oxide on sidewalls of said third polysilicon layer exposed in said bit line contact openings;

blanket etching and removing said first insulating layer in said bit line contact openings to said second source/drain contact areas of each said FET;

depositing a conformal fourth polysilicon/silicide layer on and in said second source/drain contact areas and elsewhere on said third insulating layer;

patterning by photoresist masking and anisotropic plasma etching said poly-silicon/silicide layer to form bit lines extending over said bit line contact openings, and providing further processing to complete the wiring to the peripheral circuits on the DRAM chip thereby completing said DRAM device having said stacked capacitors and bit lines.

12. The method of claim 11, wherein said first, second, and third poly-silicon layers are doped with $N^+$ type electrically conducting dopant having a concentration of between about 1.0 E 19 and 1.0 E 21 atoms/cm$^3$.

13. The method of claim 11, wherein said first polysilicon is between about 2500 and 3500 Angstroms thick.

14. The method of claim 11, wherein said first insulating layer is between about 600 and 1500 Angstroms thick.

15. The method of claim 11, wherein said second polysilicon layer is between about 3000 and 8000 Angstroms thick.

16. The method of claim 11, wherein said inter-electrode dielectric layer is composed of silicon oxide-silicon nitride-silicon oxide (ONO).

17. The method of claim 16, wherein said interelectrode dielectric layer is between about 10 and 100 Angstroms thick.

18. The method of claim 11, wherein said third polysilicon layer is between about 1000 and 2000 Angstroms thick.

19. The method of claim 11, wherein said thermal oxide on said sidewalls of said third polysilicon layer electrically insulates said top electrodes from said bit lines, said thermal oxide grown to a thickness of between about 200 and 500 Angstroms.

20. The method of claim 11, wherein said fourth polysilicon layer is $N^+$ doped having a thickness of between about 1000 and 2000 Angstroms.

21. The method of claim 11, wherein said tungsten silicide layer is between about 1000 and 2000 Angstroms thick.

* * * * *